(12) United States Patent
Eyink et al.

(10) Patent No.: US 7,618,905 B1
(45) Date of Patent: Nov. 17, 2009

(54) HETEROSTRUCTURE SELF-ASSEMBLED QUANTUM DOT

(75) Inventors: Kurt G. Eyink, Beavercreek, OH (US); David H. Tomich, New Carlisle, OH (US); Lawrence Grazulis, Tipp City, OH (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 170 days.

(21) Appl. No.: 11/789,123

(22) Filed: Apr. 23, 2007

(51) Int. Cl.
*H01L 29/66* (2006.01)

(52) U.S. Cl. ............... 438/962; 438/22; 257/E29.071; 257/E29.168

(58) Field of Classification Search ............ 438/22, 438/962; 257/E29.071, E29.168
See application file for complete search history.

(56) References Cited

U.S. PATENT DOCUMENTS

| | | | |
|---|---|---|---|
| 5,614,435 A | 3/1997 | Petroff et al. | |
| 6,583,436 B2 | 6/2003 | Petroff et al. | |
| 7,015,498 B2 * | 3/2006 | Ebe et al. | 257/14 |

* cited by examiner

*Primary Examiner*—Savitri Mulpuri
*Assistant Examiner*—Calvin Choi
(74) *Attorney, Agent, or Firm*—AFMCLO/JAZ; Gina S. Tollefson

(57) ABSTRACT

A method and device for a heterostructure self-assembled quantum dot based on inherent strain present in underlying self-assembled quantum dots for the purpose of modification and control of the properties of the self assembled quantum dots structures formed on semiconductor surfaces.

13 Claims, 4 Drawing Sheets

HETEROSTRUCTURE SELF-ASSEMBLED QUANTUM DOT

RIGHTS OF THE GOVERNMENT

The invention described herein may be manufactured and used by or for the Government of the United States for all governmental purposes without the payment of any royalty.

BACKGROUND OF THE INVENTION

Semiconductors have found wide use in a range of optical, electrical, and opto-electronic devices including amplifiers, detectors, and emitters. For the majority of these devices, high crystalline quality must be insured to prevent unwanted traps and scattering mechanisms. Typically these devices require the epitaxy of particular thicknesses of various semiconductors on one another. Initially, epitaxy was used to form bulk materials with different n and p doping in various regions. The advantage of introducing a different semiconductor, or other material, was realized and devices began to use heterojunctions to localize the electronic states and tailor their precise energy. A heterojunction occurs when dissimilar materials are brought together. This heterojunction is important in semiconductor devices, since each material has a different band gap and band alignment. By appropriate selection of these materials, electrons or holes may be localized in particular regions or block particular types of transport. A heterojunction is the junction, that is, the site, where the two dissimilar materials are brought together; a heterostructure is the overall layer structure utilizing the junctions. For example, a quantum well is a heterostructure which is formed through the use of two heterojunctions. Quantum wells are used to optimize device performance and produce new structures such as resonant tunneling diodes. More recently, researchers have started using layers with reduced dimensionality. In going from the bulk semiconductor to the quantum well, the electronic states were localized in one direction, however still remained free in the other two perpendicular directions. In the case of a quantum wire, the electronic states are confined in two directions and remain free in the other. Finally, for a quantum dot, the electronic state (electrons and holes) is confined in all directions. The confinement produces a wavefunction which has a limited spatial extent in other directions: the wave function is periodic like in the bulk.

In addition to the localization of the wave function, a change in the density of states, that is, the number of electrons at a particular energy, occurs. For a bulk material, the density of state is proportional to the square root of the energy, $E^{1/2}$. As the confinement increases from a quantum well to a quantum wire to a quantum dot, the density of states are a constant, $E^{-1/2}$, and finally a delta function. The formation of quantum dots having tailorable localized electronic states with delta function electronic states gives rise to many unique properties, which have the potential to lead to new devices. Some of these advantages are entangled states, ultra sharp wavelength detection and emission, enhanced non-linear electro-optic effects, and reduced temperature dependence of within band transitions, just to name a few. Currently quantum dots are finding uses in lasers and detectors, are being considered for single electron devices, and have the potential to be a qubit for quantum computing.

Quantum dots may be formed spontaneously, under certain conditions, during lattice-mismatched epitaxial growth. In these growths, the dots are formed upon an existing structure. Typically, the final layer of this pre-existing structure is a flat layer and is nearly dislocation free. The layer used to form self-assembled quantum dots (SAQDs) must be strained relative to the average in-plane lattice constant of the final layer of the underlying structure. Every crystal has a particular lattice constant, i.e. the size of the repeating structure in the material. Lattice mismatched materials have different "repeat" sizes and hence, in order for the structures to form without breaks in the crystal structure (i.e., grow epitaxially), one or both of the layers must be strained in order accommodate this mismatch. Low strain systems are typically around 1%. Highly strained systems typically refer to a system with ~7% or greater strain, however, three-dimensional growth is seen at times with around 3% strain. The magnitude of the strain here is $|a_{epi} - a_{sub}|/a_{sub}$ in which it is assumed all the strain is incorporated in the epitaxial layer. The symbol | | refers to the absolute value. The lattice constants of the epi-layer and the substrate are $a_{epi}$ and $a_{sub}$ respectively.

Deposition of this layer proceeds by two different growth modes. FIG. 1 shows a diagram of a typical self-assembled quantum dot formed during epitaxial growth. FIG. 1 shows a pre-existing structure at 100, a final layer of underlying structure at 101, and an original SAQD material at 102, which additional may form a wetting layer. Three-dimensional growth occurs during the deposition of the wetting layer and forms a quantum dot depicted at 105. In FIG. 1, the dot 105 is shown after growth of a layer 103 to cap the dot. In order for the quantum dot 105 to be an actual quantum dot, the electron or hole must be localized in the quantum dot or surrounding region. Finally, a capping layer 103 that is nearly lattice matched to the substrate is deposited. The purpose of the capping layer 103 is to complete the confining potential of the dots. This process allows the formation of SAQDs in quantum wells or buried SAQDs. In FIG. 1, the final layer of the underlying structure has been broken from the underlying, pre-existing structure at 100 for clarity.

A wetting layer formation in layer 102 in FIG. 1 may or may not be present, depending on which growth mode is active. It is referred to as a wetting layer since no contact angle exists between the materials. When this occurs the material is said to wet the surface. If growth initially proceeds in a flat manner and then converts to rough, three-dimensional growth, the process is termed Stranski-Krastanov and a wetting layer is expected. However, if the growth is immediately is rough and three-dimensional, the process is termed Volmer-Weber and no wetting layer is expected. In both of these processes, the quantum dots form in an effort to minimize the strain in the epitaxial layer.

In each case of self-assembled quantum dots in the prior art, the dot itself is composed of a single material. The purpose of these self-assembled quantum dots is to induce the confinement of the electron and holes spatially in three directions. Many examples of these types of growth are found in the molecular beam epitaxy of one III-V or II-VI semiconductors onto another III-V or II-VI material. A few specific examples are InAs on GaAs, InP on GaAs, GaSb on GaAs, InAs on InP, $In_{0.5}Ga_{0.5}As$ on GaAs. One of the major limitations of this type of quantum dot structure is that the confined region is composed of a single material. This limitation restricts the tuning of the electron and hole wavefunctions and their associated properties. In addition, the electrons and holes are localized in a single region. The present invention solves the limitations associated with having the confined regions composed of a single layer. With a quantum dot composed of more than one layer, as disclosed by the method of the present invention, benefits include tunability of separate electron and hole states while maintaining close proximity and hence overlap between the electron and hole wavefunctions. Also by the introduction of multiple layers, many additional configurations of the dots may be realized.

SUMMARY OF THE INVENTION

A method and device for a heterostructure self-assembled quantum dot for the purpose of modification and control of the properties of the self-assembled quantum dot structures formed on semiconductor surfaces.

It is an object of the invention to provide a method and device for forming a heterostructure self-assembled quantum dot.

It is another object of the invention to provide a method and device for adding to a quantum dot composed of a single material, formed on a semiconductor surface, subsequent materials confined locally to such quantum dot.

It is another object of the invention to provide a method and device for a heterostructure self-assembled quantum dot with the capability of tuning electron states separate from hole states.

It is another object of the invention to provide a method and device for a heterostructure self-assembled quantum dot with the capability of tuning electron states separate from hole states while maintaining close proximity and hence overlap between the electron and hole wavefunctions.

It is another object of the invention to provide a method and device for modifying and controlling structures and properties of self-assembled quantum dots formed on semiconductor surfaces.

It is another object of the invention to provide a method and device for adding to a quantum dot composed of a single material subsequent materials confined locally to such quantum dot based on the inherent strain profile present in the underlying quantum dot composed of a single material.

These and other objects of the invention are achieved through the description, claims and accompanying drawings and by a method for forming a heterostructure self-assembled quantum dot comprising the steps of:

providing a semiconductor substrate;

first, depositing a first material on said semiconductor substrate nearly lattice matched to said semiconductor substrate;

second, depositing a second material on said first material from said first depositing step, said material highly strained relative to material from said first depositing step thereby forming a self-assembled quantum dot;

selecting a third material comprising the steps of:

selecting a third material, different from said semiconductor substrate, strained in the same direction as said second material and having a small lattice constant difference relative thereto;

selecting a third material with strain sufficient to inhibit subsequent growth except in regions over said underlying self-assembled quantum dot; and selecting a third material having a bandstructure capable of confining electrons or holes relative to said underlying self-assembled quantum dot; and third, depositing said third material on said self-assembled quantum dot structure forming a heterostructure quantum dot.

DETAILED DESCRIPTION

Figure 1:
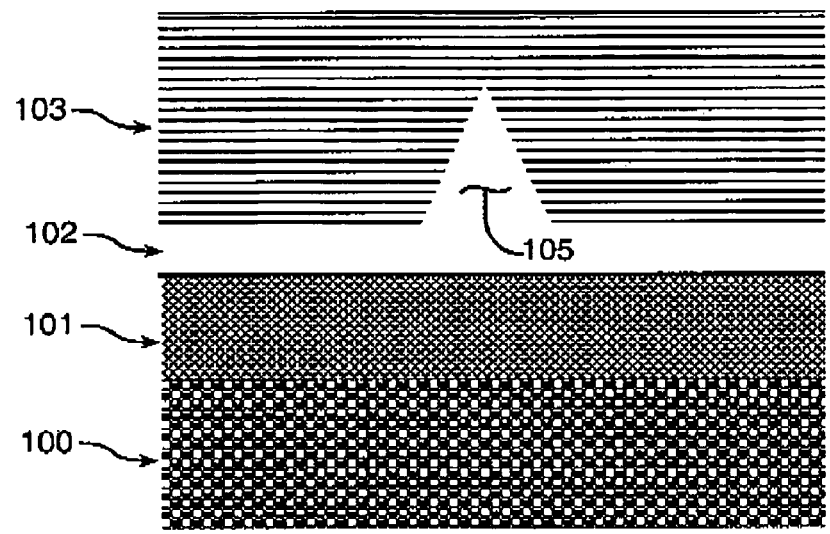
FIG. 1 shows a prior art diagram of a typical self-assembled quantum dot.
Figure 2:
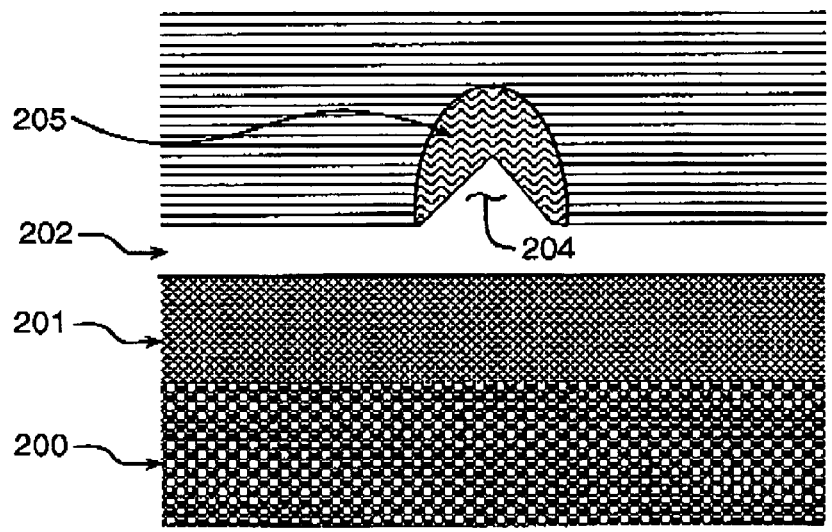
FIG. 2 shows a diagram of a heterostructure self-assembled quantum dot according to the method and device of the invention.

This present invention discloses and describes the formation of heterostructure self-assembled quantum dots (HeQuaDs) by utilizing the inherent strain profile present in an uncapped lattice mismatched quantum dot (such as in the case of InAs self-assembled quantum dots formed on GaAs, for example) to subsequently induce immediate hetero-epitaxy of a similarly strained material to form a composite dot structure as shown in FIG. 2. FIG. 2 shows a diagram of a heterojunction self-assembled quantum dot formed during epitaxial growth according to a preferred arrangement of the invention. After selecting a semiconductor substrate 200, materials are grown 201 that are nearly lattice matched on the substrate 200 using epitaxial growth techniques. This growth may be many layers depending on the application. Then a highly strained material 202 is deposited on the 201 surface to form a self-assembled quantum dot 204.

A similarly strained material is then deposited on the self-assembled quantum dot structure resulting in a heterostructure self-assembled quantum dot, illustrated at 205. According to a preferred arrangement of the invention, the similarly strained material deposited on the self-assembled quantum dot structure has additional requirements. The first requirement is that the two quantum dot materials must be strained in the same direction. That is, the material at 202 in FIG. 2 and the material at 205 in FIG. 2 must have a small lattice constant difference and must be sufficiently different than the substrate. Highly strained typically refers to ~7% mismatch, however, quantum dot formation is observed down to a strain of 3-4%. Sufficiently different in this context means that the material used in the deposition (the crown) would form quantum dots on the substrate or nearly-lattice matched material. Nearly lattice matched would be in the ~1% or less.

The second requirement is that the strain of additional dot material 205 must be of a sufficient magnitude to inhibit subsequent growth except in regions over the underlying quantum dots under certain growth conditions. For this second requirement, it is more difficult to describe numerically what is meant. The nucleation is a probabilistic event and dependent on many other parameters such as surface reconstruction, adatom diffusion length and distance between quantum dot sites. The final requirement is that the bandstructure of the second quantum dot material must confine electron or holes relative to the original self-assembled quantum dot and/or capping layer. A region which has a conduction band at lower energy than the material adjacent to it will form a region which confines electrons. Alternatively, a region which has a valence band higher in energy than the material adjacent to it will confine holes. With type I band alignments a region with a higher valence band will also have a lower conduction band and therefore confine both electrons and holes in the same region. In the case of type II alignment, the electrons and holes will be localized in different area.

Figure 4A:
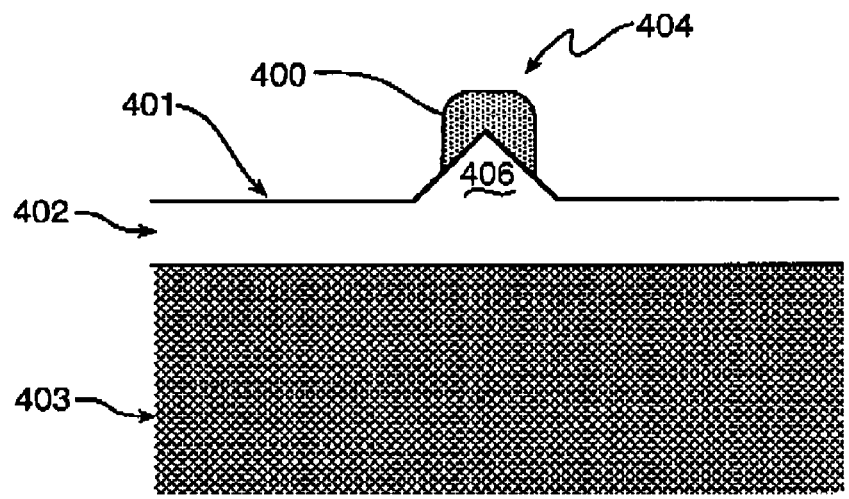
FIG. 4a shows the effect of the strain on the free energy of formation for the material as a function of position according to the method and device of the invention.
Figure 4B:
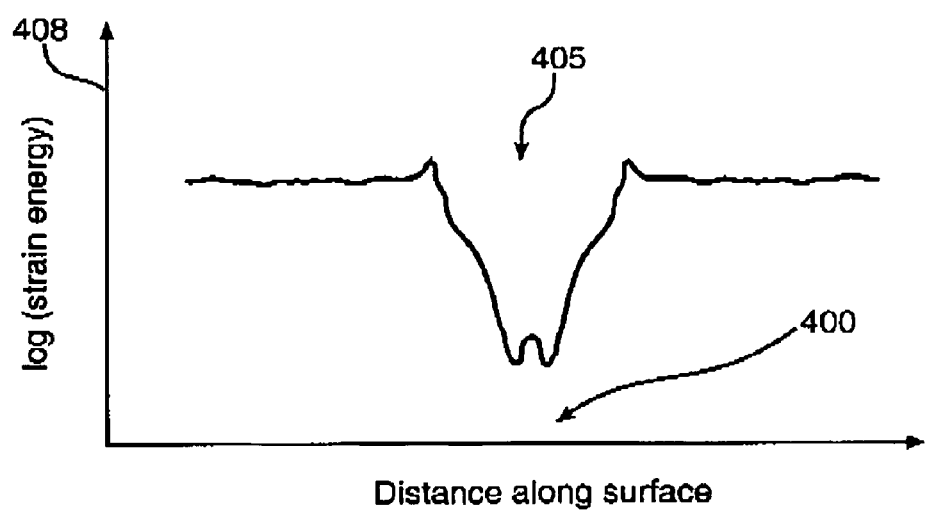
FIG. 4b shows a graph of the distance along the surface versus the strain energy of a composite heterostructure self-assembled quantum dot according to the arrangement of the invention.

FIG. 4a illustrates the effect of the strain on the nucleation of the similarly strained material that is layered on the original self-assembled quantum dot material according to the method of the invention. Nucleation is an event in which enough material has spontaneously formed to be stable. The position which has the lowest free energy will have the largest probability for nucleation. This small amount of material is termed a nucleus and will allow this type of material to grow at this site. Therefore, controlling where nucleation is favorable determines where the material will grow. The final layer of underlying structure is shown at 403 with the original SAQD material shown at 402. The original SAQD material at 402 includes the self-assembled dot at 406 and could optionally "wet the surface" and function as a wetting layer. A similarly strained material is deposited after the self-assembled quantum dot growth shown at 401. An initial nucleus of similarly strained material is shown at 404, with the most favorable position for nucleation shown at 400. FIG. 4b shows a graph of the distance along the surface versus the strain energy of a self-assembled heterojunction quantum dot according to the arrangement of the invention. That is, FIG. 4b plots the distance along the surface on the x-axis at 400 in FIG. 4b, and illustrated at 401 in FIG. 4a, against the strain energy on the y-axis at 408 with the top of the SAQD illustrated at 405.

Figure 5:
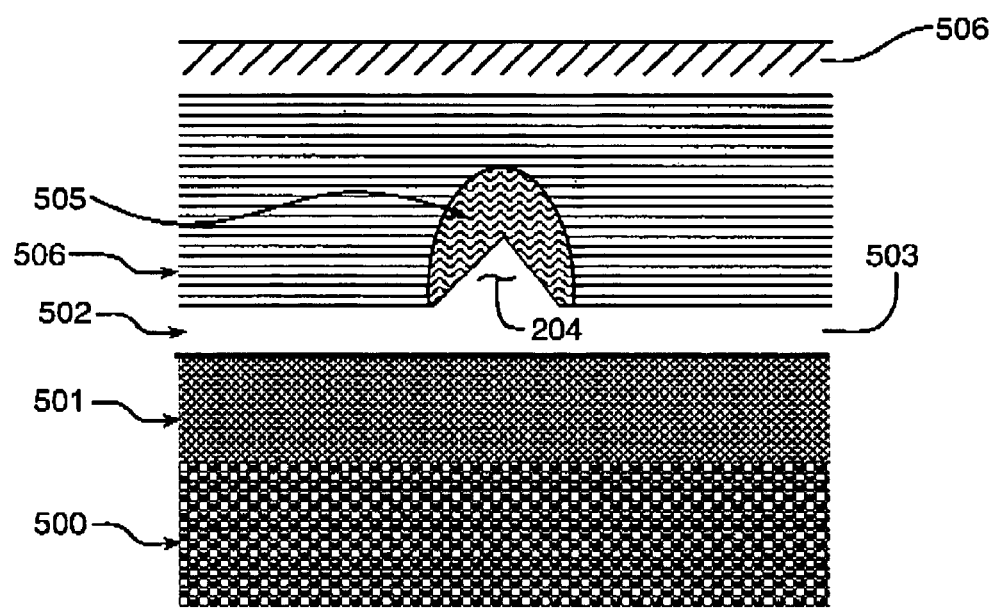
FIG. 5 shows a diagram of a heterostructure self-assembled quantum dot with a fifth material on said capped heterostructure quantum dot structure according to the method and device of the invention.

An alternative arrangement of the invention is a capped heterojunction quantum dot structure. It is produced by growing nearly lattice matched materials, illustrated at 206 in FIG. 2, to the substrate in planar growth mode over the already formed heterojunction quantum dot structure. In another alternative arrangement of the invention, a final layer may be added over the capped heterojunction quantum dot structure, this is illustrated in FIG. 5. In FIG. 5, a semiconductor substrate is shown at 500, nearly lattice matched materials are shown at 501 followed by highly strained materials at 502 forming a quantum dot at 504. A similarly strained material is then deposited at 505 and finally a fifth material is deposited on a capped heterojunction quantum dot structure at 506. By way of suggestion, additional arrangements may include layers having additional planar growths, self-assembled quantum dot growths and/or heterojunction quantum dot growths. Upon capping a composite dot with a material nearly lattice-matched to the substrate, an encapsulated/buried composite quantum dot structure is formed.

Figure 3:
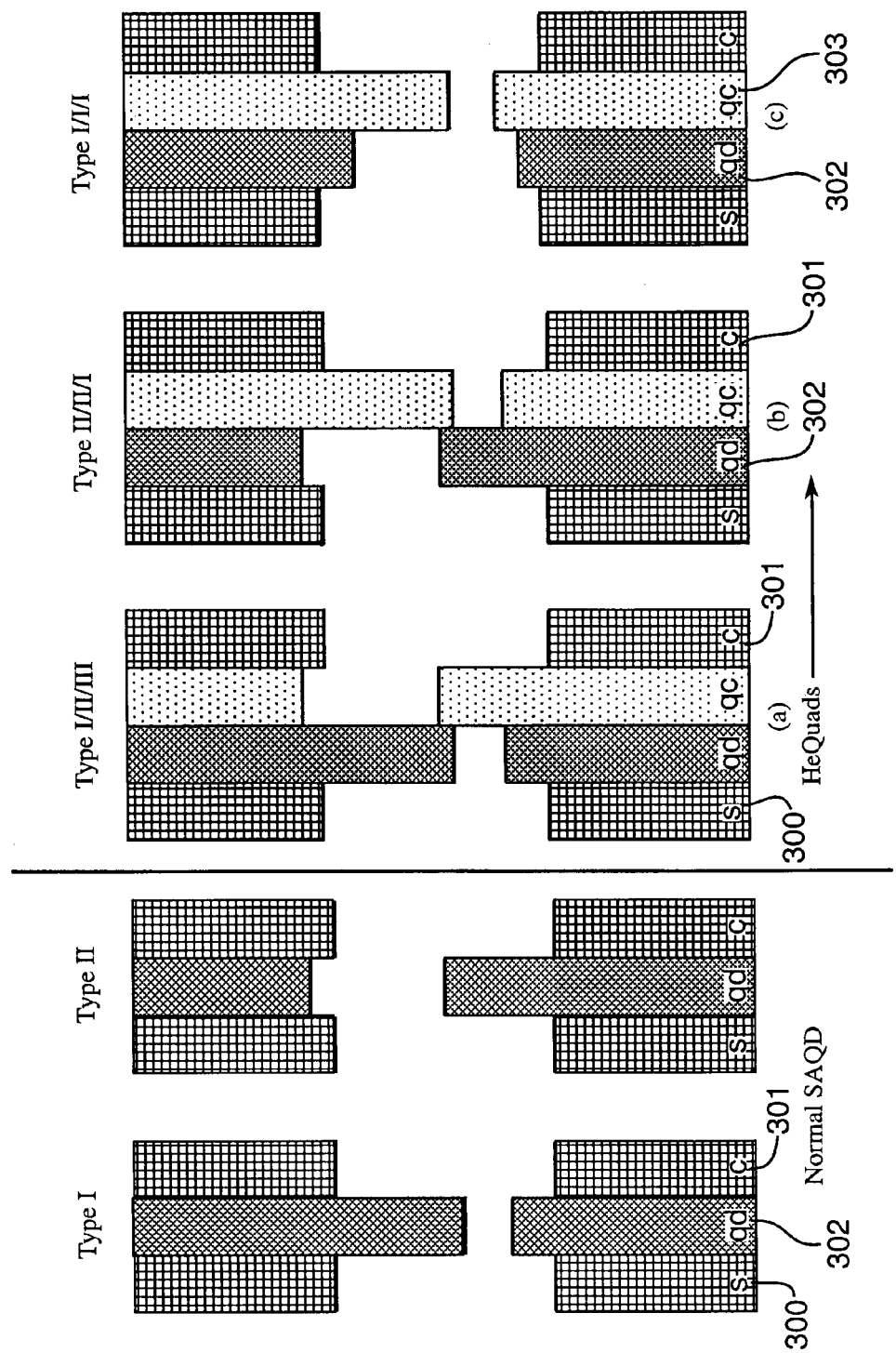
FIG. 3 shows band lines for various arrangements of heterostructure quantum dot structures according to the method and device of the invention.

There are many benefits of composing a quantum dot of more than one layer, as described and disclosed in the present invention. One important benefit is enrichment of the quantum dot structure. In typical quantum dots only a single layer determines the quantum characteristics of the dot. In the heterojunction quantum dot, more than one material defines the quantum dot structure, which expands the shape and location of the wavefunction for electrons and holes within this structure. This tailorability of the wavefunction should allow greater flexibility in the properties achievable from the quantum structure. FIG. 3 is a comparison of possible band diagrams for normal self-assembled quantum dots on the left and self-assembled heterostructure quantum dots structures on the right according to the invention. The layers labeled s at 300 and c at 301 in FIG. 3 in both the self-assembled quantum dot and self-assembled heterostructure quantum dots illustrate the bandgap for the two confining layers of the self-assembled quantum dots (illustrated at 201 and 205 in FIG. 2). In FIG. 3, the materials are depicted as the same material as shown by the same cross-hatched legend. The layer labeled qd, illustrated at 302, is the band line-up for the original self-assembled quantum dot. The layer labeled qc, illustrated at 303, is the band line-up for the second quantum-dot layer. Notice in the case of a single quantum dot, shown on the left side of FIG. 3, the band line-up (not including strain) allows only two basic varieties of structures, Type I and Type II. In the case of self-assembled heterostructure quantum dots, shown on the right side of the dividing side of FIG. 3, a large number of variations are possible by choosing materials with different band line-ups, three such variations depicted in FIG. 3 as Type I/II/III, Type II/II/I and Type I/I/I. Note also, due to the asymmetry in the initial self-assembled quantum dot, a self-assembled heterostructure quantum dot of InAs and GaSb on GaAs will be different depending on which dot was originally deposited. As FIG. 3 illustrates, a wide variety of self-assembled heterostructure quantum dots are possible.

The foregoing description of the preferred embodiment has been presented for purposes of illustration and description. It is not intended to be exhaustive or to limit the invention to the precise form disclosed. Obvious modification or variations are possible in light of the above teachings. The embodiment was chosen and described to provide the best illustration of the principles of the invention and its practical application to thereby enable on of ordinary skill in the art to utilize the invention in various embodiments and with various modifications as are suited to the particular scope of the invention as determined by the appended claims when interpreted in accordance with the breadth to which they are fairly, legally and equitably entitled.

What is claimed is:

1. A method for forming a heterostructure self-assembled quantum dot composed of multiple three-dimensionally confined regions comprising the steps of:
   providing a semiconductor substrate;
   first, depositing a first material on said semiconductor substrate nearly lattice matched to said semiconductor substrate;
   second, depositing a second material on said first material from said first step, said material highly strained relative to material from said first depositing step, thereby forming a self-assembled quantum dot;
   selecting a third material comprising the steps of:
      selecting a third material, different from said semiconductor substrate, strained in the same direction as said second material and having a smaller lattice constant difference relative thereto than a lattice constant difference relative to said first material;
      wherein said third material has a strain sufficient to inhibit subsequent growth except in regions over said self-assembled quantum dot and a bandstructure capable of confining electrons or holes relative to said self-assembled quantum dot; and
   third, depositing said third material on said self-assembled quantum dot said first and second material three-dimensionally confining electrons or holes and in intimate contact, structure-forming a heterostructure quantum dot.

2. The method of claim 1 for forming a self-assembled heterostructure quantum dot wherein said first step further comprises growing a plurality of materials.

3. The method of claim 1 for forming a self-assembled heterostructure quantum dot wherein said first step uses epitaxial growth techniques.

4. The method of claim 1 for forming a self-assembled heterostructure quantum dot wherein said first step further comprises the step of first depositing GaAs on said semiconductor substrate.

5. The method of claim 1 for forming a self-assembled heterostructure quantum dot wherein said second step further comprises the step of second depositing InAs on a layer from said first step.

6. The method of claim 1 for forming a self-assembled heterostructure quantum dot comprising the additional step of, after said third step, fourth, depositing in planar mode a fourth material lattice matched to material from said second step over said heterostructure quantum dot forming a capped heterostructure quantum dot structure.

7. The method of claim 6 for forming a self-assembled heterostructure quantum dot comprising the additional step of fifth depositing a fifth material on said capped heterostructure quantum dot structure.

8. The method of claim 6 for forming a self-assembled heterostructure quantum dot comprising the additional fifth step of depositing a fifth material on said capped heterostructure quantum dot structure thereby confining electrons and holes relative to material from said fourth step thereby expanding the shape and location of a wave formation from said electrons and holes.

9. The method of claim 1 for forming a self-assembled heterostructure quantum dot wherein said third step includes forming a wetting layer.

10. The method of claim 1 for forming a self-assembled heterostructure quantum dot wherein said third step further comprises depositing a material on said self-assembled quantum dot at a location where nucleation is most favorable.

11. A method for forming a heterostructure self-assembled quantum dot composed of multiple three-dimensionally confined regions comprising the steps of:
providing a semiconductor substrate;
first, depositing a first material on said semiconductor substrate nearly lattice matched to said semiconductor substrate;
second, depositing a second material on said first material from said first step, said material highly strained relative to material from said first depositing step, thereby forming a self-assembled quantum dot;
selecting a third material comprising the steps of:
  selecting a third material, different from said semiconductor substrate, strained in the same direction as said second material and having a smaller lattice constant difference relative thereto than a lattice constant difference relative to said first material;
  wherein said third material has a strain sufficient to inhibit subsequent growth except in regions over said self-assembled quantum dot and a bandstructure capable of confining electrons or holes relative to said self-assembled quantum dot; and
third, depositing said third material on said self-assembled quantum dot said first and second material three-dimensionally confining electrons or holes and in intimate contact possessing a heterojunction barrier and forming zero dimensional regions, thereby forming a heterostructure quantum dot.

12. The method of claim 1, wherein said smaller lattice constant difference is about 0% to about 4%.

13. The method of claim 11, wherein said smaller lattice constant difference is about 0% to about 4%.

* * * * *